(12) United States Patent
Tobin et al.

(10) Patent No.: US 6,613,199 B1
(45) Date of Patent: Sep. 2, 2003

(54) APPARATUS AND METHOD FOR PHYSICAL VAPOR DEPOSITION USING AN OPEN TOP HOLLOW CATHODE MAGNETRON

(75) Inventors: Jeffrey A. Tobin, Mountain View, CA (US); Jean Qing Lu, Palo Alto, CA (US); Thomas Mountsier, San Jose, CA (US); Hong Mei Zhang, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 15 days.

(21) Appl. No.: 10/033,165

(22) Filed: Oct. 25, 2001

(51) Int. Cl.[7] ............................................. C23C 14/35
(52) U.S. Cl. ..................... 204/192.12; 204/298.12; 204/298.16; 204/298.18; 204/298.19; 204/298.21
(58) Field of Search ..................... 204/192.1, 192.12, 204/298.06, 298.12, 298.14, 298.16, 298.18, 298.19, 298.21

(56) References Cited

U.S. PATENT DOCUMENTS

| 4,622,121 A | 11/1986 | Wegmann et al. ............ 204/298 |
| 4,865,712 A | 9/1989 | Mintz .......................... 204/298 |
| 5,171,415 A | 12/1992 | Miller et al. ............ 204/298.09 |
| 5,188,717 A | 2/1993 | Broadbent et al. ...... 204/192.12 |
| 5,252,194 A | 10/1993 | Demaray et al. ......... 204/298.2 |
| 5,482,611 A | 1/1996 | Helmer et al. .......... 204/298.17 |
| 5,490,910 A * | 2/1996 | Nelson et al. .......... 204/192.15 |
| 5,593,551 A | 1/1997 | Lai ........................ 204/192.12 |
| 6,179,973 B1 | 1/2001 | Lai et al. ................ 204/192.12 |
| 6,238,528 B1 * | 5/2001 | Xu et al. ................ 204/192.12 |

* cited by examiner

*Primary Examiner*—Steven H. VerSteeg
(74) *Attorney, Agent, or Firm*—Okamoto & Benedicto LLP

(57) ABSTRACT

A hollow cathode magnetron comprises an open top target within a hollow cathode. The open top target can be biased to a negative potential so as to form an electric field within the cathode to generate a plasma. The magnetron uses at least one electromagnetic coil to shape and maintain a density of the plasma within the cathode. The magnetron also has an anode located beneath the cathode. The open top target can have one of several different geometries including flat annular, conical and cylindrical, etc.

16 Claims, 8 Drawing Sheets

APPARATUS AND METHOD FOR PHYSICAL VAPOR DEPOSITION USING AN OPEN TOP HOLLOW CATHODE MAGNETRON

BACKGROUND OF THE INVENTION

1. Field of the Invention

This invention relates generally to Physical Vapor Deposition ("PVD") systems, and more particularly to an apparatus and method for improving PVD processes using an open top Hollow Cathode Magnetron ("HCM") source.

2. Description of the Background Art

Physical vapor deposition ("PVD") is a well known technique for depositing metal layers onto semiconductor wafers (also referred to herein as "substrates"). These thin metal layers can be used as diffusion barriers, adhesion or seed layers, primary conductors, antireflection coatings, and etch stops, etc.

In a conventional Hollow Cathode Magnetron ("HCM"), magnetic fields are used to generate a high density plasma of Argon ("Ar") or other suitable inert gas and target material within a cathode of the HCM. The magnetic fields are also used to confine the plasma within the HCM. The cathode has a target, which can be made of metals such as Tantalum ("Ta"), Aluminum ("Al"), Titanium ("Ti"), Copper ("Cu"), or other suitable metal. A power supply supplies a negative potential to the target such that the magnetic fields in combination with the negative potential cause plasma ions to hit the target with high energy, which in turn cause target atoms to dislodge from the surface of the target by direct momentum transfer and also create secondary electrons. These dislodged atoms and ions (created by the secondary electrons) are then deposited on the semiconductor wafer.

However, the atoms are typically dislodged from the sidewall of the target at a higher rate than at the top of the target. This can lead to more deposition than erosion at the top of the target. Redeposition has a higher potential to form particles or delamination than an eroded area of the target.

SUMMARY

The present invention provides a system for performing PVD using an open top HCM source, increasing the efficiency of using target material and decreasing redeposition. In one embodiment, the apparatus comprises a HCM with an open top cylindrical sputtering target having a negative bias, thereby forming an electric filed within the HCM to generate a plasma. To seal the HCM for PVD processes, a shield is placed on the top of HCM in place of target material, thereby allowing the HCM to be evacuated. The HCM also comprises electromagnetic coils that shape and increase density of a plasma of inert gas within the HCM. Plasma ions strike the target, thereby dislodging target atoms, which then deposit on the wafer.

In another embodiment of the invention, the HCM uses a flat annular target arranged in a horizontal position in place of the cylindrical target. In a third embodiment of the invention, the HCM uses a conical open top target arranged at a 45-degree angle. It will be recognized by one skilled in the art that in alternative embodiments the open top target can be shaped and aligned at any angle.

As the target in each of the above-mentioned embodiments does not have a top/central portion, the HCM is more efficient to operate since the target comprises less metal but does not lower deposition rates. Further, using the conical open top target leads to more target material flowing out of a mouth of the target than in a conventional HCM because the target mouth has many times the area of the open top of the target, thereby yielding higher deposition rates. In addition, redeposition becomes less of a problem since the target does not contain a top portion on which redeposited particles can form.

The present invention further provides a method for PVD using a topless target. The method uses the apparatus described above and comprises the steps of maintaining a plasma within a cathode of the HCM; sputtering target material from the open top target; and depositing the sputtered target material onto the wafer.

The system and method may advantageously perform PVD onto a wafer using an open top target while improving on the deposition rate of a conventional HCM.

DETAILED DESCRIPTION OF THE PREFERRED EMBODIMENT

The following description is provided to enable any person skilled in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
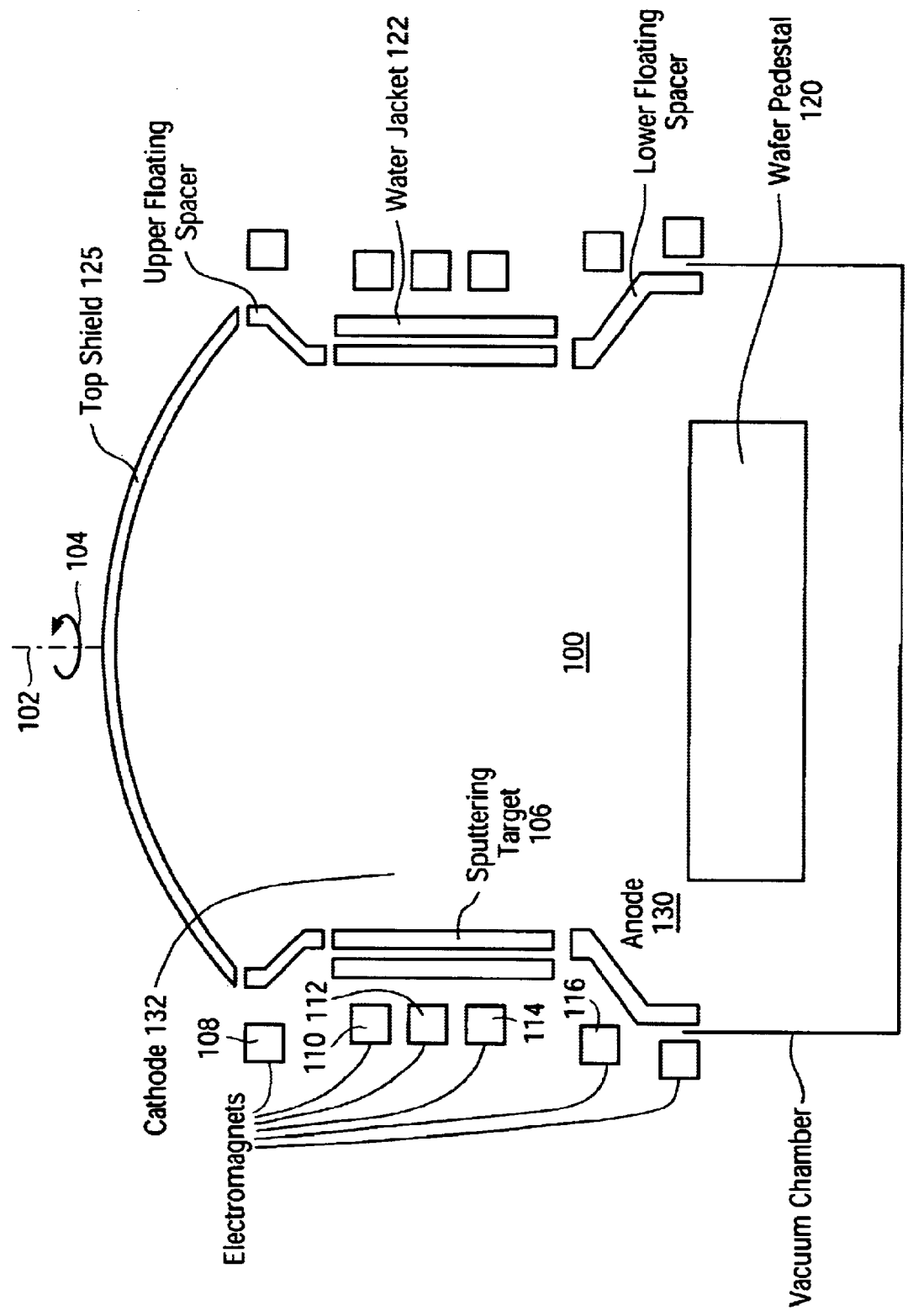
FIG. 1 shows a schematic diagram of a cylindrical open top HCM according to an embodiment of the invention.
Figure 2:
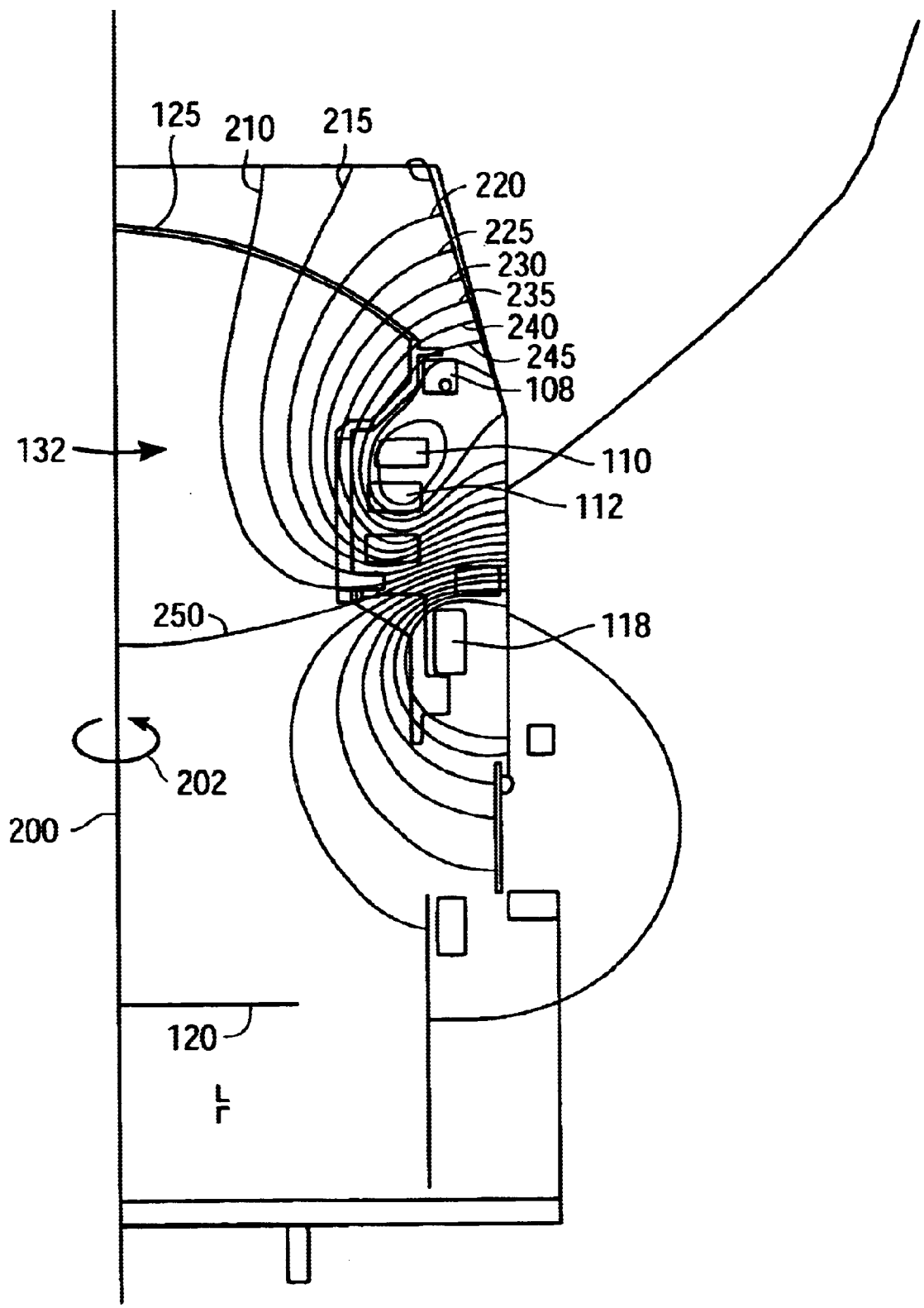
FIG. 2 shows a magnetostatic simulation plot for the open top HCM of FIG. 1.
Figure 3:
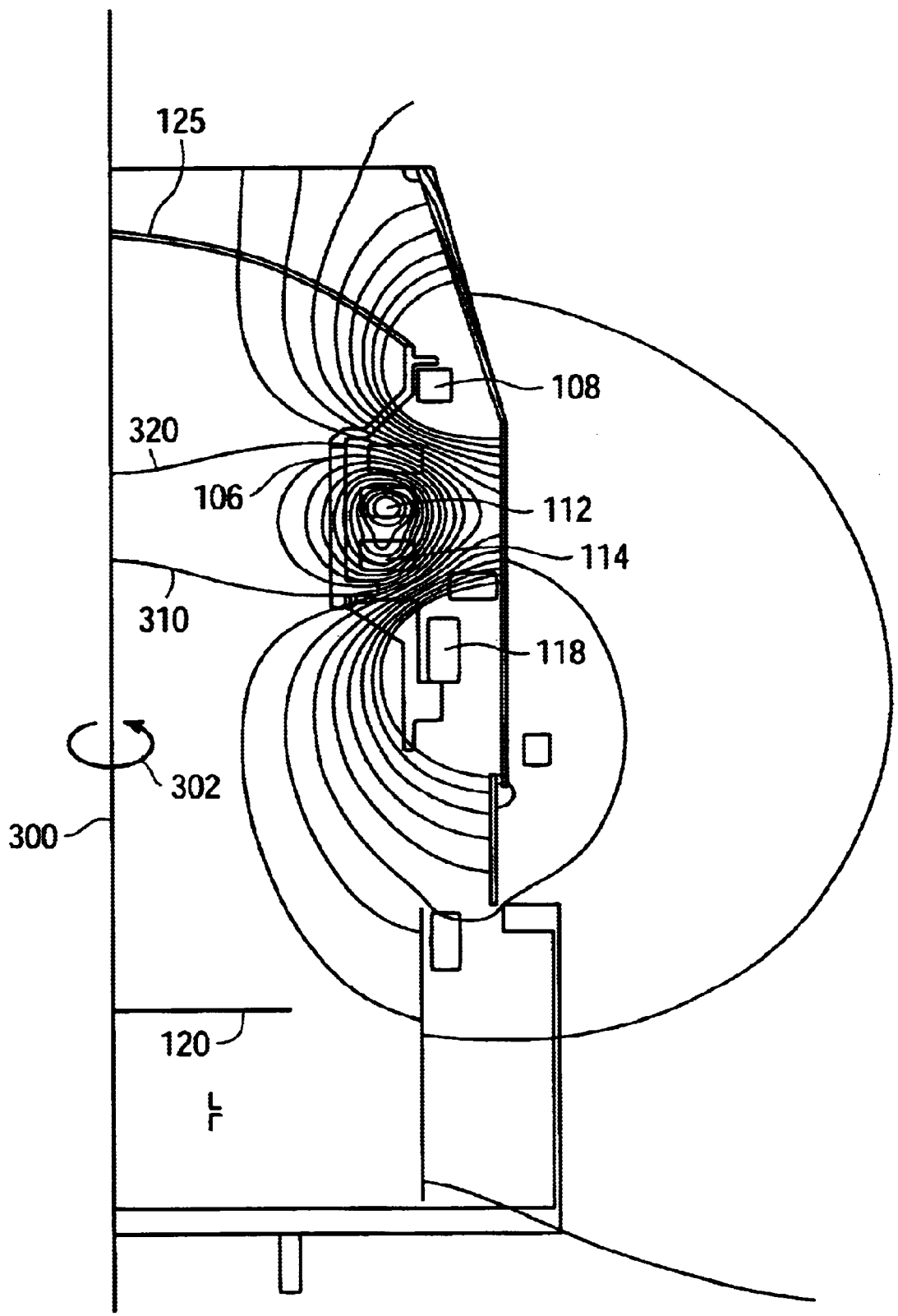
FIG. 3 shows a magnetostatic simulation plot for a double separatrix configuration of the open top HCM of FIG. 1.

FIG. 1 shows a schematic diagram of a cylindrical open top HCM 100 according to an embodiment of the invention. The HCM 100 is symmetrical in shape around axis 102 as indicated by arrow 104. HCM 100 has a cathode 132, wherein the plasma is generated, and an electrically floating anode 130 located beneath the mouth of target 106. Target 106 is composed of tantalum ("Ta"), which may be biased to about −300 to −400 volts using voltage from a power supply (not shown). In an alternative embodiment of the present invention, the target 106 is composed of titanium, copper, or other suitable material. The target 106 is aligned vertically in the HCM 100 and has an open top. In order to complete a seal for the HCM 100 for forming a vacuum before generating a plasma, a top shield 125 is located on the top of HCM 100 where the top of target 106 would be in a conventional HCM. As shown in FIG. 1, HCM 100 further includes a wafer pedestal 120. Pedestal 120 is also shown in FIGS. 2 and 3.

Argon, nitrogen or other suitable gases and mixtures known in the art of physical vapor deposition that do not appreciably react with the target 106 is injected into HCM 100 by an injector (not shown). Pressure within the HCM 100 is generally maintained at about 0.5 mTorr but may be up to several hundred mTorrs. The negatively biased voltage between target 106 and HCM 100 generates an electric field that generates plasma from the inert gas.

HCM 100 also comprises electromagnetic ("EM") coils 108, 110, 112, and 114, which, in concert, generate a magnetic field that enhances and shapes the plasma formed from electric fields within the HCM source 100. The plasma is generally a high-density plasma on the order of $10^{13}$ ions/cm$^3$. Due to the negative potential of the target 106, ions from the plasma impact the tantalum target 106 causing Ta atoms to sputter off of the surface of the target 106 due to direct momentum transfer. The Ta atoms then enter the plasma where they may be ionized and transported to the wafer as an ion. The electromagnetic coils 116 and 118 are used to shape the plasma and achieve uniform ion transport to the wafer.

HCM 100 also comprises a water jacket 122, which cools the target 106. As target 106 is an open top geometry, HCM 100 does not require a rotating permanent magnet above cathode 132 to cause the plasma ions to sputter target material from the top of target 106. Further, additional or fewer electromagnetic coils may be added or subtracted from the HCM 100, as long as a plasma can be shaped and maintained at a sufficient density within cathode 132.

In an alternative embodiment of the invention, HCM 100 comprises an additional wafer pedestal (not shown) above cathode 132. As target 106 comprises an open top geometry, the target 106 has, in effect, two target mouths from which target material exits. Accordingly, a second wafer pedestal for PVD can be placed above the open top of target 106, thereby doubling the rate at which wafers can be processed in HCM 100.

FIG. 2 shows a magnetostatic simulation plot for the open top HCM 100 (FIG. 1). The HCM 100 is symmetrical about axis 200 as indicated by arrow 202. Coils 108, 110, 112, and 118, which have strengths of 0, 1500, 1200, −2400, amp-turns respectively, are used to generate magnetic field lines 210, 215, 220, 225, 230, 235, 240, 245, and separatrix 250. Generally speaking, a separatrix is a three-dimensional surface that divides the magnetic flux into two pieces: that which returns to the opposite magnetic pole by flowing inside the target and that which flows outside the target. Commonly owned U.S. Pat. No. 6,179,973 also discusses the concept of separatrix in HCMs. The just-mentioned patent is incorporated herein by reference in its entirety. The strength of the field lines 210, 215, 220, 225, 230, 235, 240, and 245 can be varied by modifying the current flow in the coils 108, 110, 112, and 118. Alternatively, coils 108, 110, 112, and 118 may be permanent magnets.

Magnetic field lines 210, 215, 220, 225, 230, 235, 240, and 245 represent the strength of the magnetic field in the plasma, which is used to increase plasma density in the target 106 and downstream and to shape the plasma to get better uniformity at the substrate or wafer. Plasma ions impacting target 106 cause target atoms to dislodge from the target 106 due to direct momentum transfer. The impact also forms secondary electrons, which ionize a fraction of the dislodged target atoms. In contrast to a conventional HCM, uniform erosion of the target 106 is not a problem since target 106 has an open top geometry. Further, redeposition is less of a concern due to the open top geometry of target 106. If the shield 125 becomes contaminated with redeposited particles, the shield 125 can be easily replaced at low cost. In comparison, if target 106 did not have an open top geometry, the plasma in cathode 132 would not uniformly erode the top of the target, leading to a waste of target material.

FIG. 3 shows a magnetostatic simulation plot for a double separatix configuration of the open top HCM 100 (FIG. 1). In the magnetostatic simulation plot of FIG. 3, as in the plot of FIG. 2, the HCM 100 is symmetrical about axis 300 as indicated by arrow 302. The plot of FIG. 3 varies from the plot of FIG. 2 in that the FIG. 3 plot has two separatrixes 310 and 320. Separatrix 310 and 320 are generated by the magnetic coils 108, 112, 114, and 118, which have strengths of −5,000 amp-turn; 1,000 amp-turn; −4,500 amp-turn; and −3,000 amp-turn, respectively. The advantage of using a double separatrix configuration is that the configuration increases magnetic flux lines parallel to the target 106, along which electrons travel, thereby creating a high density plasma adjacent to the target 106 leading to erosion of the target 106.

Figure 4:
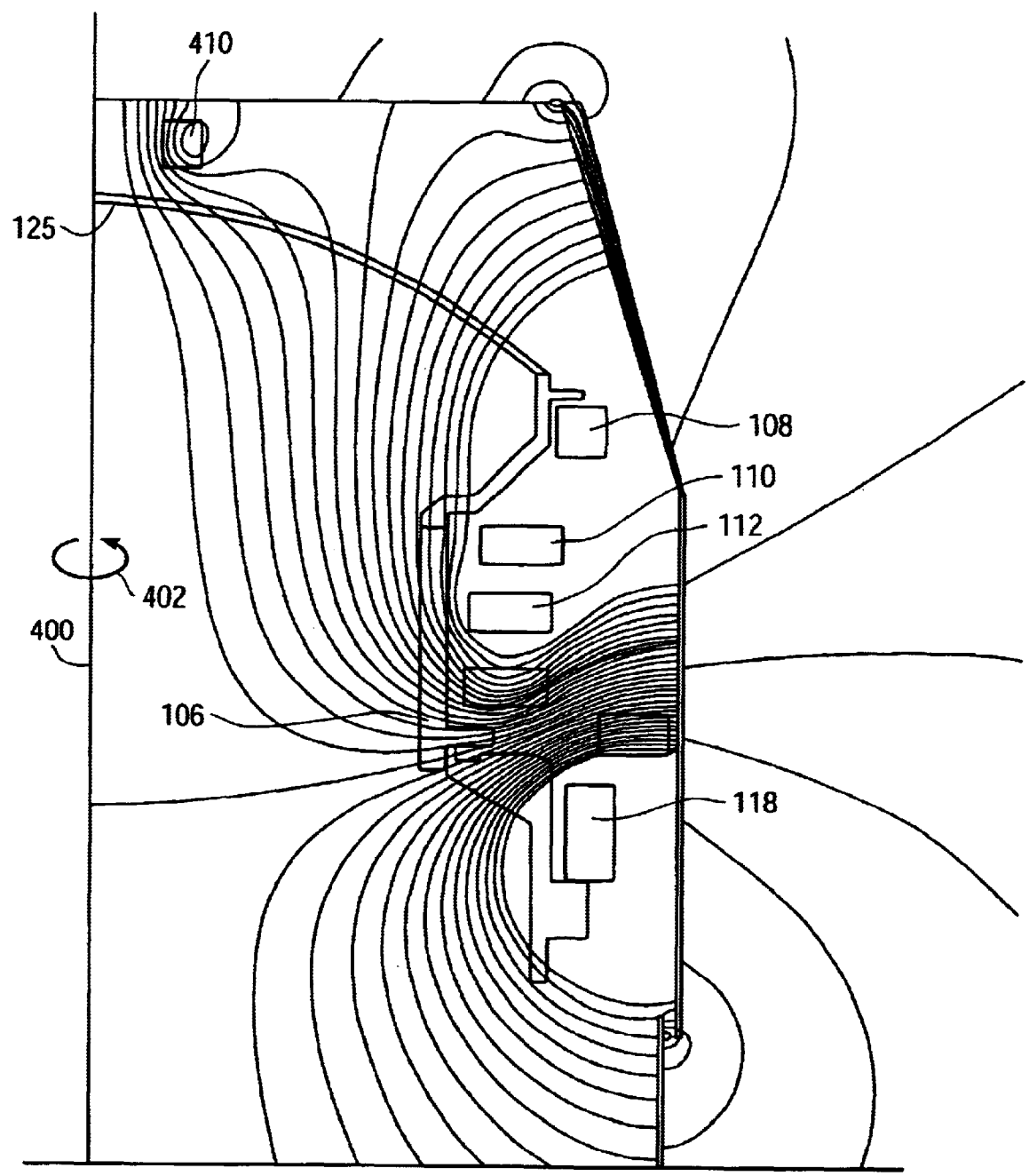
FIG. 4 shows a magnetostatic simulation plot for a pinched top configuration of the open top HCM of FIG. 1.

FIG. 4 shows a magnetostatic simulation plot for a pinched top configuration of the open top HCM 100 (FIG. 1). The HCM 100 is symmetrical about axis 400 as indicated by arrow 402. The FIG. 4 embodiment of HCM 100 comprises an additional coil 410 located above the top shield 125. In this embodiment, coil 410 has a strength of 2,500 amp-turn, and coils 108, 110, 112, and 118 have strengths of 3,000 amp-turn, 1,500 amp-turn, 1,200 amp-turn; and −3,000 amp-turn, respectively. Coil 410 creates a magnetic mirror that repels plasma from shield 125, thereby preventing redeposition onto the shield 125.

Figure 5:
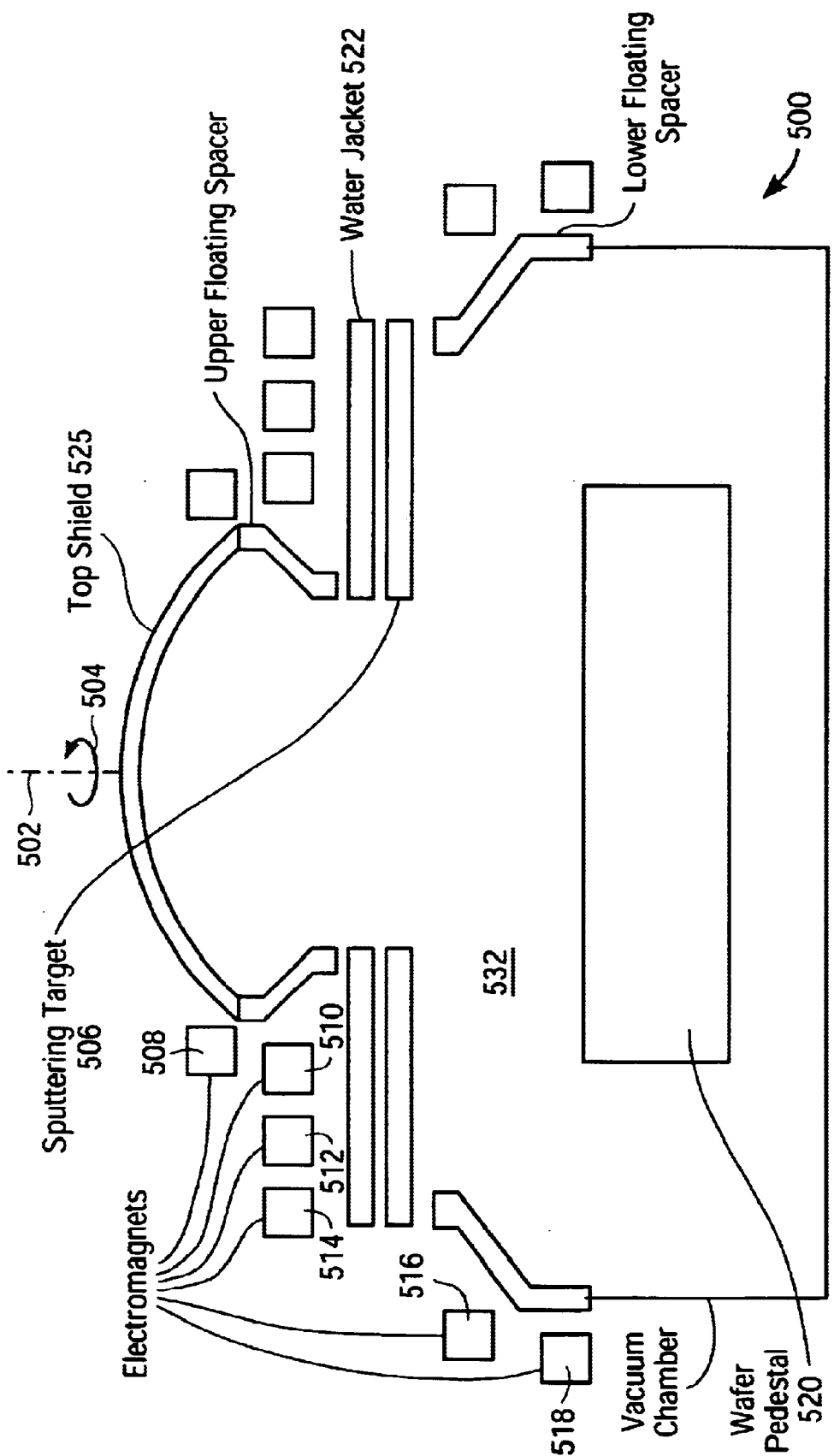
FIG. 5 shows a schematic diagram of a flat annular HCM according to an embodiment of the invention.

FIG. 5 shows a schematic diagram of a flat annular HCM 500 according to an embodiment of the invention. The HCM 500 is symmetrical about axis 502 as indicated by arrow 504. HCM 500 comprises a flat annular target 506 of Ta, Ti, Cu or other suitable material charged to a negative bias so as to form an electric field within the HCM 500 that generates a plasma. HCM 500 further comprises a top shield 525 in place of a target 506 top. The HCM 500 also has a water jacket 522, which cools target 506 during PVD processes. HCM 500 also comprises electromagnetic coils 508, 510, 512, and 514 for shaping and increasing density of a plasma within a cathode 532 of the HCM 500. Additionally, HCM 500 comprises anode coils 516 and 518. While HCM 500 comprises six electromagnetic coils in total, any number of coils may be used as long as the number of coils is sufficient to shape and maintain a sufficient density of a plasma within cathode 532. Further, in another embodiment of HCM 500, electromagnetic coils 508, 510, 512, 514, 516, and 518 may be replaced with permanent magnets or HCM 500 may comprise a combination of electromagnetic coils and permanent magnets.

An advantage of the flat annular geometry of HCM 500 is that the target 506 is directly facing the wafer pedestal 520. Accordingly, sputtered target material will usually have a velocity in the direction of the wafer pedestal 520, thereby increasing the deposition rate over a conventional HCM, wherein the target sidewalls are at right angles to the wafer pedestal and therefore sputtered target material must undergo a collision with plasma in order to be redirected towards the wafer pedestal.

Figure 6:
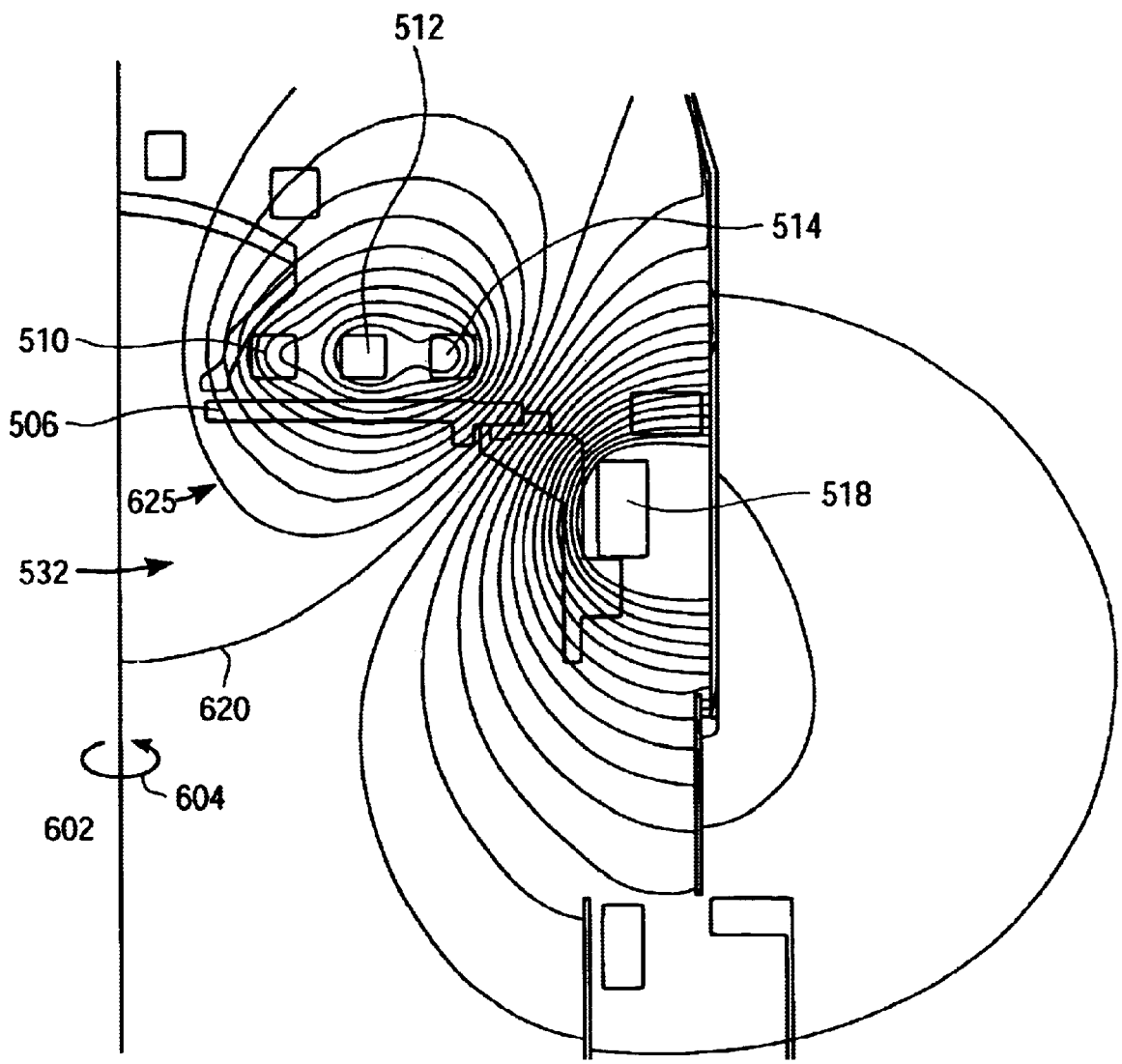
FIG. 6 shows a magnetostatic simulation plot for the flat annular HCM of FIG. 5.

FIG. 6 shows a magnetostatic simulation plot for the flat annular HCM 500 (FIG. 5). The HCM 500 is symmetrical about axis 602 as indicated by arrow 604. Electromagnetic coils 510, 512, 514, and 518 have strengths of −1,200 amp-turn, −1,200 amp-turn, −800 amp-turn, and 1,500 amp-turn, respectively. The plasma is located in cathode 532 above and below the separatrix 620 and electrons are generally confined by the magnetic field, as shown by field lines 625, causing plasma density near the target 506 to be high. An electric field causes electrons from the plasma to strike target 506 and dislodge target atoms due to direct momentum transfer. As can be seen for the flat annular geometry, only a minimum of magnetic fields lines 625 cross shield 525, leading to a minimum of redeposition onto shield 525. If shield 525 becomes contaminated with material, the shield 525 can easily be replaced with another inexpensive shield. In comparison, if target 506 did not have an open top geometry, the plasma in cathode 532 would not uniformly erode the top of the target, leading to a waste of target material.

Figure 7:
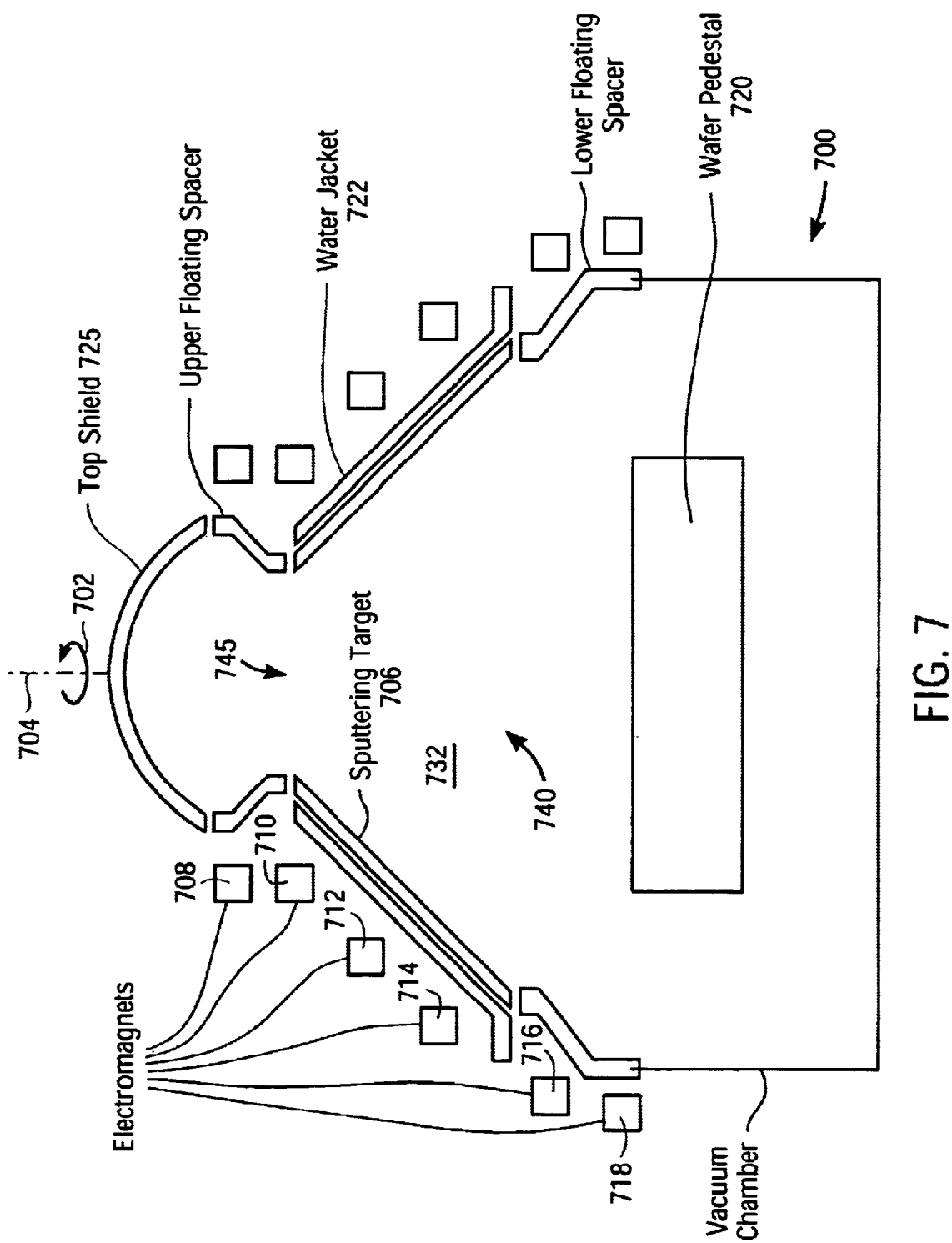
FIG. 7 shows a schematic diagram of a conical open HCM according to an embodiment of the invention.

FIG. 7 shows a schematic diagram of a conical open top HCM 700 according to an embodiment of the invention. The HCM 700 is symmetrical about axis 702 as indicated by arrow 704. HCM 700 comprises a conical open top target 706 of Ta, Ti, Cu or other suitable material charged to a negative bias so as to form an electric field within HCM 700. HCM 700 further comprises a top shield 725 in place of a target 706 top, and a water jacket 722, which cools target 706 during PVD processes. HCM 700 also comprises electromagnetic coils 708, 710, 712, and 714 for shaping and increasing the density of a plasma within a cathode 732 of the HCM 700. Additionally, HCM 700 comprises anode coils 716 and 718. While HCM 700 comprises six electromagnetic coils in total, any number of coils may be used as long as the number of coils is sufficient to shape and increase the density of a plasma within cathode 732. Further, in another embodiment of HCM 700, electromagnetic coils 708,710,712, 714,716, and 718 may be replaced with permanent magnets or HCM 700 may comprise a combination of electromagnetic coils and permanent magnets. As shown in FIG. 7, HCM 700 further includes a wafer pedestal 720.

An advantage of the conical open top geometry of HCM 700 is that the geometry provides for about nine times the open area at the target mouth 740 than at the open top 745. Accordingly, a higher proportion of target material will flow out of target mouth 740 than out of open top 745, leading to faster deposition rates. In comparison, in HCM 100, using the magnetic field configuration of FIG. 2, an equal amount of target material may flow out of the target 106 (FIG. 1) mouth and the target 106 open top, leading to conventional deposition rates.

Figure 8:
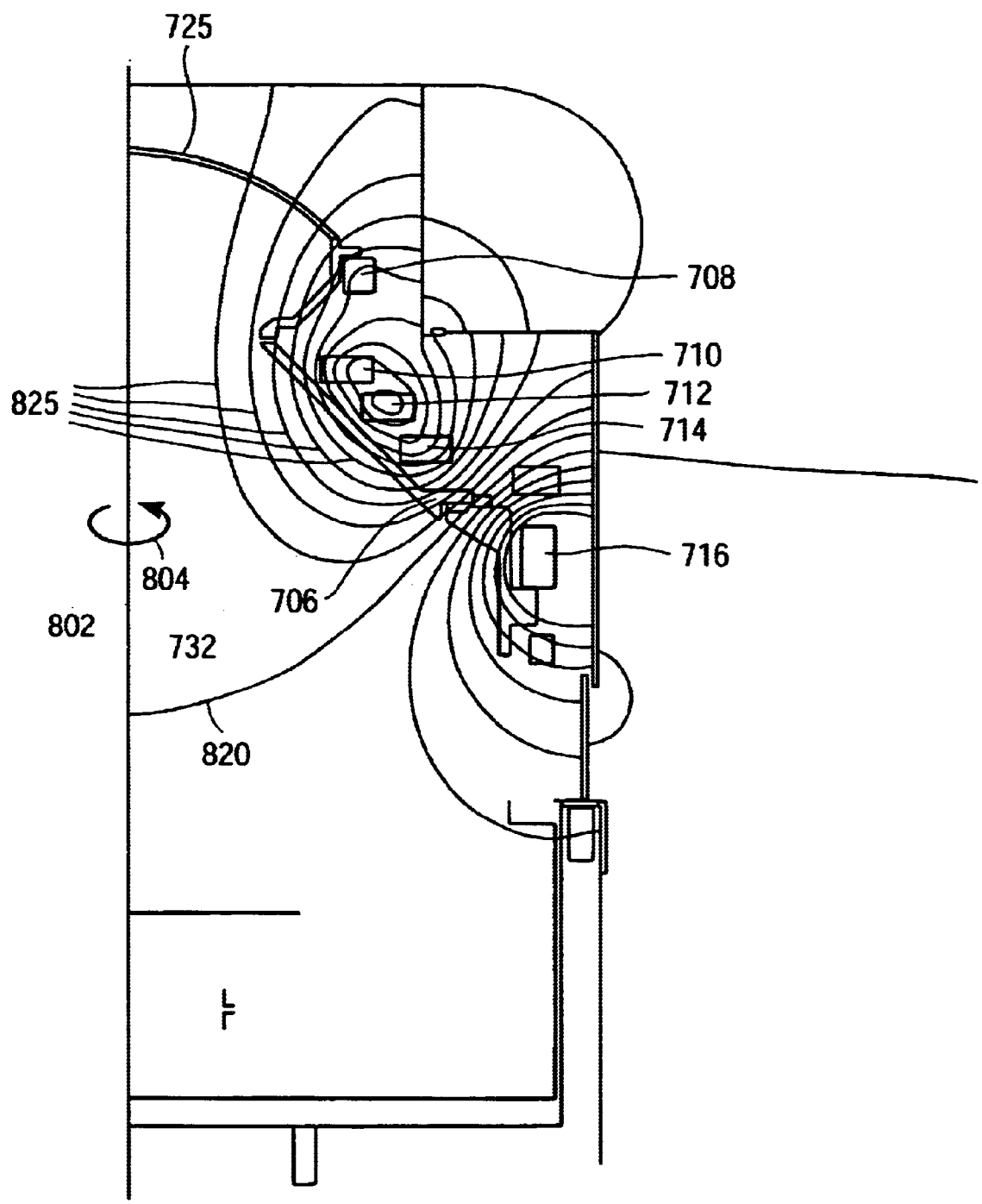
FIG. 8 shows a magnetostatic simulation plot of the conical open top HCM of FIG. 7.

FIG. 8 shows a magnetostatic simulation plot for the conical open top HCM 700 (FIG. 7). The HCM 700 is symmetrical about axis 802 as indicated by arrow 804. Electromagnetic coils 708, 710,712, 714, and 716 have strengths of −300 amp-turn, −700 amp-turn, −700 amp-turn, −400 amp-turn, and 900 amp-turn, respectively. The plasma is located in cathode 732 above and below the separatrix 820 and electrons are generally confined by the magnetic field, as shown by field lines 825, causing plasma density near the target 706 to be high. An electric field causes electrons from the plasma to strike target 706 and dislodge target atoms due to direct momentum transfer. As can be seen for the conical open top geometry, only a minimum of magnetic fields lines 825 cross shield 725, leading to a minimum of redeposition onto shield 725. If shield 725 becomes contaminated with material, the shield 725 can easily be replaced with another inexpensive shield. In comparison, if target 706 did not have an open top geometry, the plasma in cathode 732 would not uniformly erode the top of the target, leading to a waste of target material.

The foregoing description of the preferred embodiment of the present invention is by way of example only, and other variations and modifications of the above-described embodiments and methods are possible in light of the foregoing teaching. For example, target 106 may be comprised of titanium instead of tantalum. Further, the number, type and shape of components or magnetic materials shown can be varied to achieve the same effect as that disclosed herein. The present invention is limited only by the following claims.

What is claimed is:

1. A hollow cathode magnetron, comprising:
    a hollow cathode, the cathode having an open top target and at least one magnet, the open top target configured to have a potential thereon to generate an electric field to form a plasma within the hollow cathode magnetron, the at least one magnet configured to generate a separatrix within the hollow cathode magnetron; and
    an anode located beneath the hollow cathode.
2. The hollow cathode magnetron of claim 1, wherein the at least one magnet includes at least one electromagnetic coil.
3. The hollow cathode magnetron of claim 1, wherein the open top target includes a conical open top geometry.
4. The hollow cathode magnetron of claim 1 wherein the open top target includes a cylindrical open top geometry.
5. The hollow cathode magnetron of claim 4, further comprising a first and a second wafer pedestal, the first pedestal located beneath a mouth of the target, the second pedestal located above an open top of the target.
6. The hollow cathode magnetron of claim 4, wherein a separatrix is located at each open end of the target.
7. The hollow cathode magnetron of claim 4, wherein the at least one magnet generates a pinched top magnetic field within the cathode.
8. A method of magnetron sputtering, comprising:
    generating an electric field within a cathode of a hollow cathode magnetron to form a plasma, the magnetron having an open top target;
    generating a magnetic field and a separatrix within the hollow cathode magnetron;
    using the plasma to sputter atoms from the target in the hollow cathode magnetron; and
    depositing the atoms onto a substrate.
9. The method of claim 8, wherein the open top target includes a flat annular geometry.
10. The method of claim 8, wherein the open top target includes a conical open top geometry.
11. The method of claim 8, wherein the open top target includes a cylindrical open top geometry.
12. The method of claim 11, wherein the magnetic field includes a double separatrix magnetic field.
13. The method of claim 11, wherein the magnetic field includes a pinched top magnetic field.
14. A hollow cathode magnetron, comprising:
    means for generating an electric field within a hollow cathode magnetron to form a plasma, the hollow cathode magnetron having an open top target;
    means for generating a magnetic field and a separatrix within the hollow cathode magnetron;
    means for using the plasma to sputter atoms from the target in the hollow cathode magnetron; and
    means for depositing the atoms onto a substrate.
15. A hollow cathode magnetron, comprising:
    a hollow cathode, the cathode including
        a cylindrical target with a top and a bottom open end, the cylindrical target capable to be charged to a negative potential so as to form an electric field for generating a plasma, at least one magnet to shape and maintain a density of a plasma within the cathode and to generate a separatrix within the cathode, and
        a top shield sealing the top open end of the target;
    an anode located beneath the cathode; and
    a pedestal downstream of the cathode to hold a substrate.
16. A magnetron, comprising:
    a plasma source, the source having an open top target and at least one magnet, the open top target having a flat annular geometry and configured to have a potential thereon to generate an electric field to form a plasma within the magnetron, the at least one magnet configured to generate magnetic fields and a separatrix to shape and increase density of a plasma within the source; and
    an anode located beneath the source.

* * * * *